US010269790B2

(12) United States Patent
Cheng et al.

(10) Patent No.: US 10,269,790 B2
(45) Date of Patent: *Apr. 23, 2019

(54) FORMING HORIZONTAL BIPOLAR JUNCTION TRANSISTOR COMPATIBLE WITH NANOSHEETS

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US); Geng Wang, Stormville, NY (US); Qintao Zhang, Mt. Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/933,768

(22) Filed: Mar. 23, 2018

(65) Prior Publication Data
US 2018/0261593 A1   Sep. 13, 2018

Related U.S. Application Data

(63) Continuation of application No. 15/454,248, filed on Mar. 9, 2017, now Pat. No. 9,991,254.

(51) Int. Cl.
*H01L 27/06* (2006.01)
*H01L 21/8249* (2006.01)
(Continued)

(52) U.S. Cl.
CPC .......... *H01L 27/0623* (2013.01); *B82Y 10/00* (2013.01); *H01L 21/02532* (2013.01);
(Continued)

(58) Field of Classification Search
CPC ......... H01L 21/02601; H01L 21/02603; H01L 21/02606; H01L 29/66545;
(Continued)

(56) References Cited

U.S. PATENT DOCUMENTS 9,679,780 B1 * 6/2017 Bi ........................ H01L 29/0673
9,842,835 B1 * 12/2017 Cheng ................. H01L 27/0629
(Continued)

OTHER PUBLICATIONS

Kangguo Cheng et al., "Forming Horizontal Bipolar Junction Transistor Compatible With Nanosheets", U.S. Appl. No. 15/454,248, filed Mar. 9, 2017.
(Continued)

*Primary Examiner* — Scott B Geyer
(74) *Attorney, Agent, or Firm* — Cantor Colburn LLP; Vazken Alexanian

(57) ABSTRACT

A semiconductor device includes a substrate and a field effect transistor (FET) arranged on the substrate. The FET includes a gate positioned on the substrate. The gate includes a nanosheet extending through a channel region of the gate. The FET includes a pair of source/drains arranged on opposing sides of the gate. The semiconductor device further includes a bipolar junction transistor (BJT) arranged adjacent to the FET on the substrate. The BJT includes an emitter and a collector. The BJT includes a nanosheet including a semiconductor material extending from the emitter to the collector, with a doped semiconductor material arranged above and below the nanosheet.

20 Claims, 12 Drawing Sheets

(51) Int. Cl.
  H01L 29/06    (2006.01)
  H01L 27/07    (2006.01)
  H01L 29/66    (2006.01)
  H01L 29/78    (2006.01)
  H01L 21/02    (2006.01)
  B82Y 10/00    (2011.01)
  H01L 29/735   (2006.01)
  H01L 29/10    (2006.01)
  H01L 29/165   (2006.01)
  H01L 29/775   (2006.01)
  H01L 29/73    (2006.01)

(52) U.S. Cl.
  CPC ...... *H01L 21/8249* (2013.01); *H01L 27/0635* (2013.01); *H01L 27/0711* (2013.01); *H01L 27/0722* (2013.01); *H01L 29/0673* (2013.01); *H01L 29/1008* (2013.01); *H01L 29/6625* (2013.01); *H01L 29/66553* (2013.01); *H01L 29/735* (2013.01); *H01L 29/785* (2013.01); *H01L 29/165* (2013.01); *H01L 29/66265* (2013.01); *H01L 29/66545* (2013.01); *H01L 29/7317* (2013.01); *H01L 29/775* (2013.01)

(58) Field of Classification Search
  CPC ........... H01L 29/66871; H01L 27/0623; H01L 21/8248; H01L 21/8249
  See application file for complete search history.

(56) References Cited

U.S. PATENT DOCUMENTS 9,991,254 B1 * 6/2018 Cheng ................ H01L 27/0635
2015/0364542 A1 * 12/2015 Rodder ................ B82Y 10/00
                                                    257/29

OTHER PUBLICATIONS

List of IBM Patents or Patent Applications Treated as Related; (Appendix P), Filed Mar. 23, 2018, 2 pages.

* cited by examiner

FORMING HORIZONTAL BIPOLAR JUNCTION TRANSISTOR COMPATIBLE WITH NANOSHEETS

PRIORITY

This application is a continuation of and claims priority from U.S. patent application Ser. No. 15/454,248, filed on Mar. 9, 2017, entitled "FORMING HORIZONTAL BIPOLAR JUNCTION TRANSISTOR COMPATIBLE WITH NANOSHEETS," the entire contents of which are incorporated herein by reference.

BACKGROUND

Embodiments of the present invention relate in general to metal-oxide-semiconductor field-effect transistors (MOSFETs), and more specifically, to forming horizontal bipolar junction transistors that are compatible with nanosheet transistors.

CMOS technology is used to construct integrated circuits such as microprocessors, microcontrollers, static random access memory (RAM) and other digital logic circuits. A basic component of CMOS designs is the MOSFET.

As semiconductor devices scale to smaller dimensions, nanosheet (nanowire) devices are being pursued as viable device architectures for scaling CMOS beyond 7 nm. In nanosheet devices, gate structures are disposed between conducting nanosheet structure stacks. Stacked nanosheets provide, for example, increased drive current within a given layout area.

SUMMARY

According to one or more embodiments of the invention, a method of forming a field effect transistor (FET) and a bipolar junction transistor (BJT) on a common substrate includes forming two nanosheet stacks on a substrate. The two nanosheets stacks include a first nanosheet stack in a FET region and a second nanosheet stack in a BJT region. The first nanosheet stack and the second nanosheet stack each include a first nanosheet arranged on the substrate and a second nanosheet arranged on the first nanosheet. The method includes forming a first dummy gate on the first nanosheet stack and a second dummy gate on the second nanosheet stack. The first dummy gate and the second dummy gate each include a sacrificial gate material arranged between gate spacers. The method includes depositing a semiconductor material on opposing sides of the first dummy gate and the second dummy gate. The semiconductor material forms source/drains of the FET region, and the semiconductor material forms an emitter and a collector of the BJT region. The method includes removing the sacrificial gate material between the gate spacers of the first dummy gate and the second dummy gate, removing the first nanosheet from the FET region and the BJT region, and removing the gate spacers from the BJT region. The method includes depositing doped semiconductor material on and around the second nanosheet of the BJT region, and depositing a metal gate stack on and around the second nanosheet of the FET region.

According to other embodiments, a method of forming a field effect transistor (FET) and a bipolar junction transistor (BJT) on a common substrate includes forming two nanosheet stacks on a substrate. The two nanosheet stacks include a first nanosheet stack in a FET region and a second nanosheet stack in a BJT region. The first nanosheet stack and the second nanosheet stack each include a first nanosheet arranged on the substrate and a second nanosheet arranged on the first nanosheet. The method includes forming a first dummy gate on the first nanosheet stack and a second dummy gate on the second nanosheet stack. The first dummy gate and the second dummy gate each include a sacrificial gate material arranged between gate spacers. A width of the second dummy gate of the BJT region is greater than a width of the first dummy gate of the FET region. The method includes depositing a doped semiconductor material on opposing sides of the first dummy gate and the second dummy gate. The doped semiconductor material forms source/drains of the FET region, and the doped semiconductor material forms an emitter and a collector of the BJT region. The method includes removing the sacrificial gate material between the gate spacers of the first dummy gate and the second dummy gate. The method includes removing the first nanosheet by a selective etch process from the FET region and the BJT region, with the second nanosheet remaining suspended between the gate spacers. The method includes disposing a mask on the FET region, and removing the gate spacers from the BJT region. The method includes depositing doped semiconductor material on and around the second nanosheet of the BJT region, and depositing a metal gate stack on and around the second nanosheet of the FET region.

Yet, according to other embodiments, a semiconductor device includes a substrate and a field effect transistor (FET) arranged on the substrate. The FET includes a gate positioned on the substrate. The gate includes a nanosheet extending through a channel region of the gate. The FET includes a pair of source/drains arranged on opposing sides of the gate. The semiconductor device further includes a bipolar junction transistor (BJT) arranged adjacent to the FET on the substrate. The BJT includes an emitter and a collector. The BJT includes a nanosheet including a semiconductor material extending from the emitter to the collector, with a doped semiconductor material arranged above and below the nanosheet.

BRIEF DESCRIPTION OF THE DRAWINGS

The subject matter which is regarded as embodiments of the invention is particularly pointed out and distinctly claimed in the claims at the conclusion of the specification. The foregoing and other advantages of the embodiments of the invention are apparent from the following detailed description taken in conjunction with the accompanying drawings in which:

FIGS. 1-12 illustrate exemplary methods of making semiconductor devices according to one or more embodiments, in which:

FIG. 1 is a cross-sectional side view of a nanosheet stack formed on a substrate;

FIG. 2 is a cross-sectional side view after patterning the nanosheets to form stacks in two areas, a field effect transistor (FET) area and a bipolar junction transistor (BJT) area;

FIG. 3 is a cross-sectional side view after forming dummy gates nanosheet stacks;

FIG. 4 is a top view of FIG. 3;

FIG. 5 is a cross-sectional side view after depositing semiconductor material;

FIG. 6 is a cross-sectional side view of a FET and adjacent BJT with a larger gate according to one or more embodiments;

FIG. 7 is a cross-sectional side view after depositing an interlevel dielectric (ILD) and removing the dummy gates;

FIG. 8 is a cross-sectional side view after selectively removing the first nanosheets in the channel regions;

FIG. 9 is a cross-sectional side view after depositing a mask on the FET and removing gate spacers in the BJT;

FIG. 10 is a cross-sectional side view after depositing doped semiconductor material in the BJT channel region;

FIG. 11 is a cross-sectional side view after removing the mask and forming metal gates in the FET region; and FIG. 12 is a cross-sectional side view after forming contacts.

DETAILED DESCRIPTION

Figure 1:
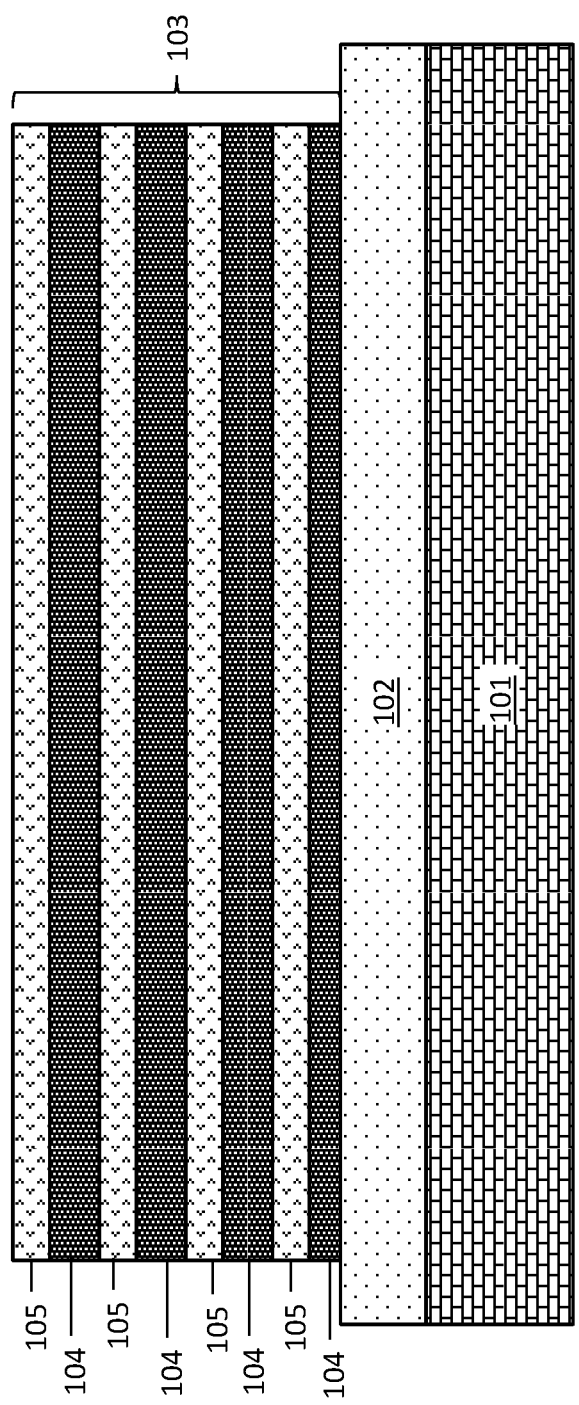

Embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature or characteristic, but every embodiment may or may not include the particular structure or characteristic. Moreover, such phrases are not necessarily referring to the same embodiment. Further, when a particular structure or characteristic is described in connection with an embodiment, it is submitted that it is within the knowledge of one skilled in the art to affect such structure or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication can or cannot be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to aspects of the present invention, nanosheet devices are being pursued as viable device architectures for scaling CMOS to smaller dimensions, as mentioned above. However, in order to implement nanosheet devices in a practical way, the architecture needs to be incorporated into BJT devices, in addition to logic transistors and on-chip analog devices.

A BJT device is "bipolar" because it uses both electron and hole charge carriers. In contrast, unipolar transistors, such as field effect transistors (FETs), only use one kind of charge carrier. BJTs use two junctions between two semiconductor types, n-type and p-type. BJTs are manufactured in two types, "NPN" and "PNP." The basic function of a BJT is to amplify current. BJTs are thus used as amplifiers or switches, giving them wide applicability in electronic equipment.

Accordingly, described herein are methods and structures for forming a nanosheet BJT that can be integrated with nanosheet CMOS for device scaling beyond 7 nm. A nanosheet FET and a nanosheet BJT are formed on the same (common) substrate. The nanosheets used in the channel region of the BJT greatly increase the BJT gain due to a narrow and controllable base dimension.

Turning now to a detailed description of aspects of the present invention, FIGS. 1-12 illustrate exemplary methods of making semiconductor devices according to embodiments. FIG. 1 is a cross-sectional side view of a nanosheet stack 103 formed on a substrate 101. The substrate 101 includes one or more semiconductor materials. Non-limiting examples of substrate 101 materials include Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof.

The substrate 101 includes a buried oxide layer 102 arranged thereon. The composition of the buried oxide layer 102 depends on the type of substrate 101. The buried oxide layer 102 includes an oxide, for example, silicon oxide.

The nanosheet stack 103 includes alternating layers of a first nanosheet 104 and a second nanosheet 105. The first nanosheet 104 is arranged on the substrate 101, and the second nanosheet 105 is arranged on the first nanosheet 104. The first nanosheet 104 is a semiconductor material, for example, silicon germanium. Other non-limiting examples of semiconductor materials for the first nanosheet 104 include Si (silicon), strained Si, SiC (silicon carbide), Ge (germanium), SiGeC (silicon-germanium-carbon), Si alloys, Ge alloys, GaAs (gallium arsenide), InAs (indium arsenide), InP (indium phosphide), or any combination thereof.

The second nanosheet 105 alternates with the first nanosheet 104 in the nanosheet stack 103. The second nanosheet 105 is a semiconductor material that is different than the material of the first nanosheet 104, for example, silicon. Other non-limiting examples of semiconductor materials for the second nanosheet 105 include strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof. In an exemplary embodiment, first nanosheet 104 is silicon germanium, and second nanosheet 105 is silicon.

Although nanosheet stack 103 includes four layers of first nanosheet 104 and four layers of second nanosheet 105, the nanosheet stack 103 can include any number of first nanosheets 104 and second nanosheets 105. The nanosheet stack 103 can include one or more layers of each of first nanosheet 104 and second nanosheet 105. For example, nanosheet stack 103 can include one layer of first nanosheet 104 positioned in contact with the substrate 101 (or buried oxide layer 102) and one layer of second nanosheet 105 disposed on the first nanosheet 104.

First and second nanosheets 104, 105 are formed on the substrate 101 by for example, chemical vapor deposition (CVD), liquid phase or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

Figure 2:
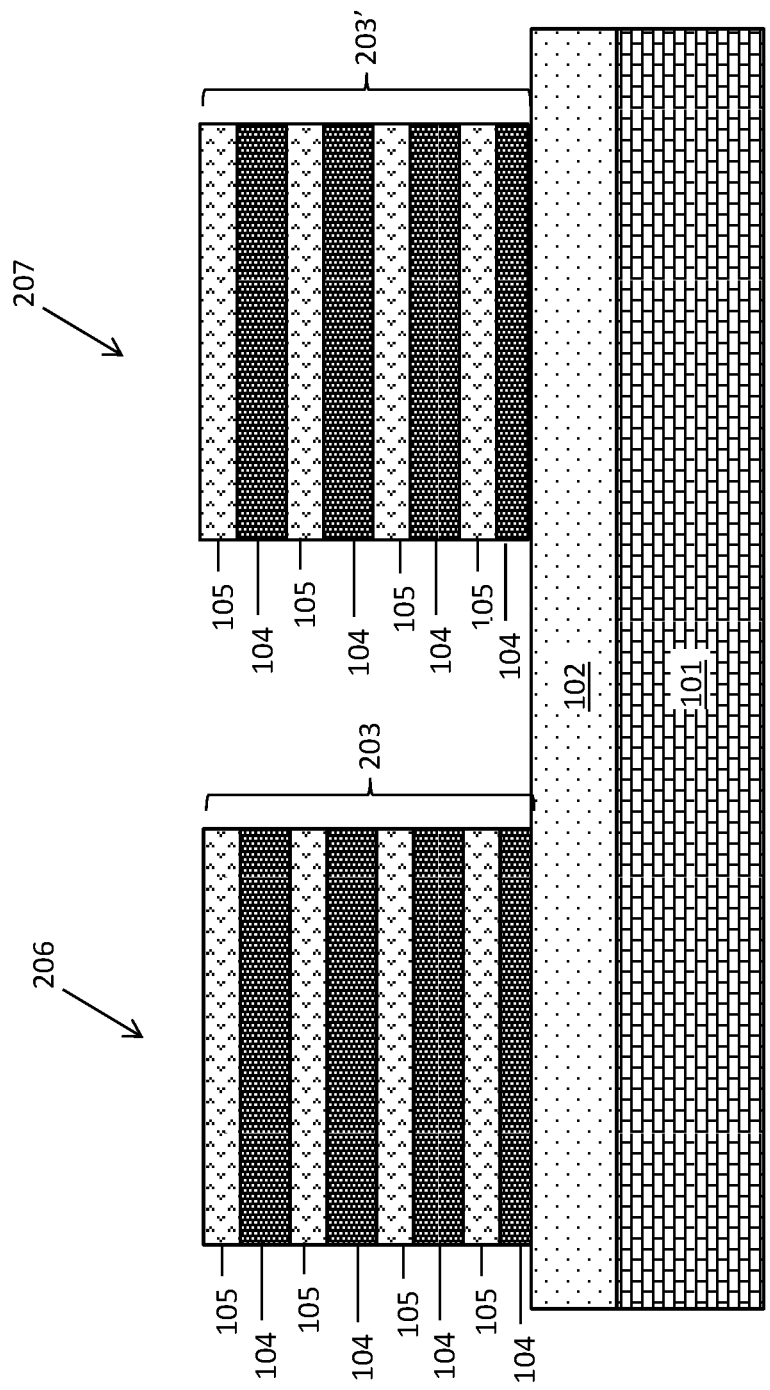

FIG. 2 is a cross-sectional side view after patterning the nanosheets to form two stacks of two transistors, namely a field effect transistor (FET) and a bipolar junction transistor (BJT). The FET will be formed over an area of the substrate 101,102 identified in FIG. 2 as a FET area 206. The BJT will be formed over an area of the substrate 101, 102 identified in FIG. 2 as a BJT area 207. First nanosheet stack 203 is formed for the FET area 206, and second nanosheet stack 203' is formed for the BJT area 207. A dry etch process, for example, a reactive ion etch (RIE) process, is performed to etch nanosheet stack 103 (of FIG. 1), removing a portion of the nanosheet stack 103 between the transistor areas. The FET and the BJT follow the same process flow, as shown in the following figures.

Figure 3:
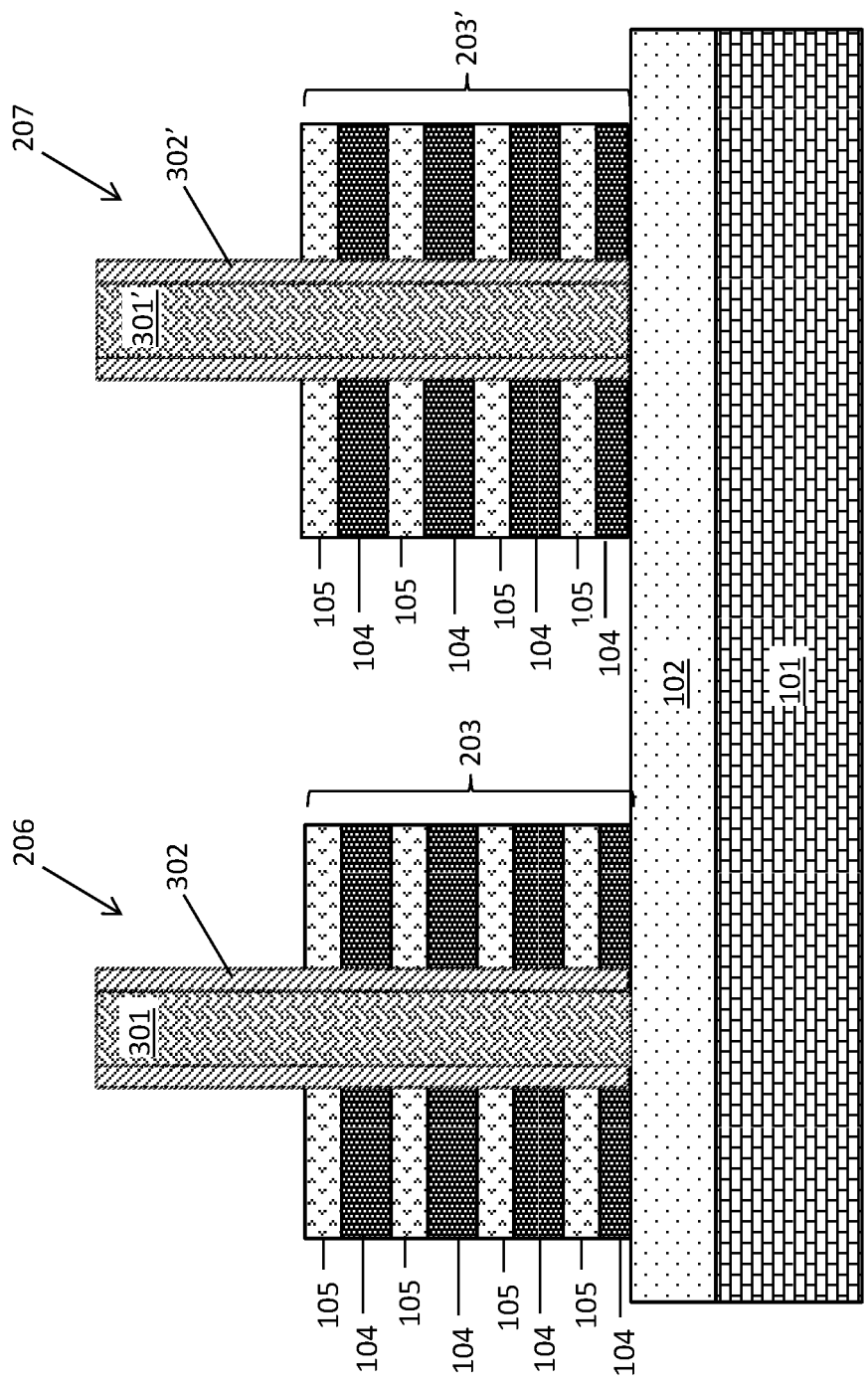
Figure 4:
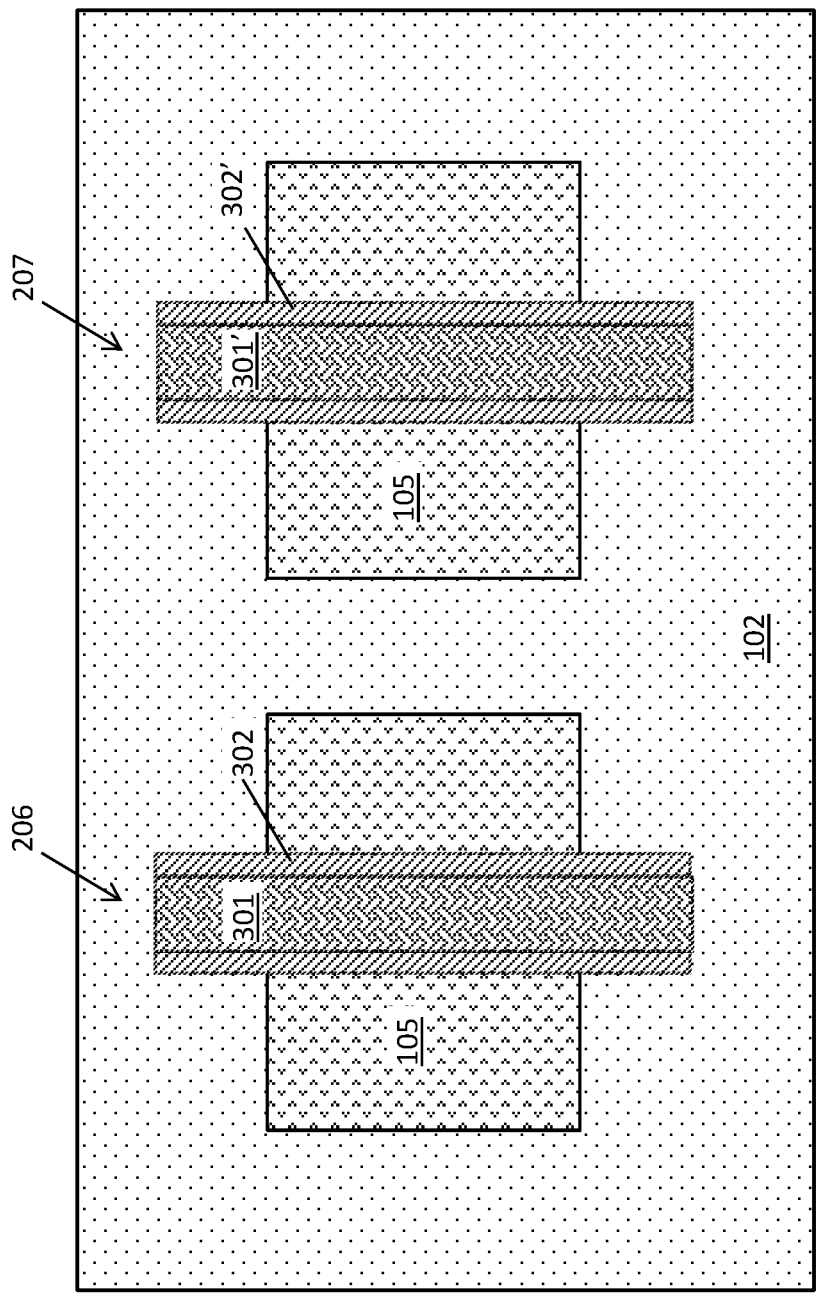

FIG. 3 is a cross-sectional side view after forming dummy gates 301, 301' on the nanosheet stacks of the FET area 206 and the BJT area 207. FIG. 4 is a top view of FIG. 3, which illustrates how the dummy gates 301, 301' wrap around the nanosheets. A first dummy gate 301 is formed in the FET area 206, and a second dummy gate 301' is formed in the BJT area 207.

The dummy gate 301 in the FET area 206 and the dummy gate 301' in the BJT area 207 include a dummy gate material (sacrificial gate material). The dummy gate material is deposited on the first nanosheet stack 203 and the second nanosheet stack 203'. The dummy gate material is, for example, amorphous silicon (aSi) or polycrystalline silicon (polysilicon). The dummy gate material is deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof.

The dummy gates 301, 301' include gate spacers 302, 302' arranged along sidewalls. The gate spacers 302, 302' include an insulating material, for example, silicon dioxide, silicon nitride, SiOCN, or SiBCN. The gate spacer material is deposited on the dummy gate materials and then etched. The gate spacer material is deposited by a deposition process, for example, chemical vapor deposition (CVD) or physical vapor deposition (PVD). An anisotropic dry etch process, for example, reactive ion etch (RIE), is performed after depositing the spacer material to form the gate spacers 302, 302' around the dummy gates 301, 301'.

Figure 5:
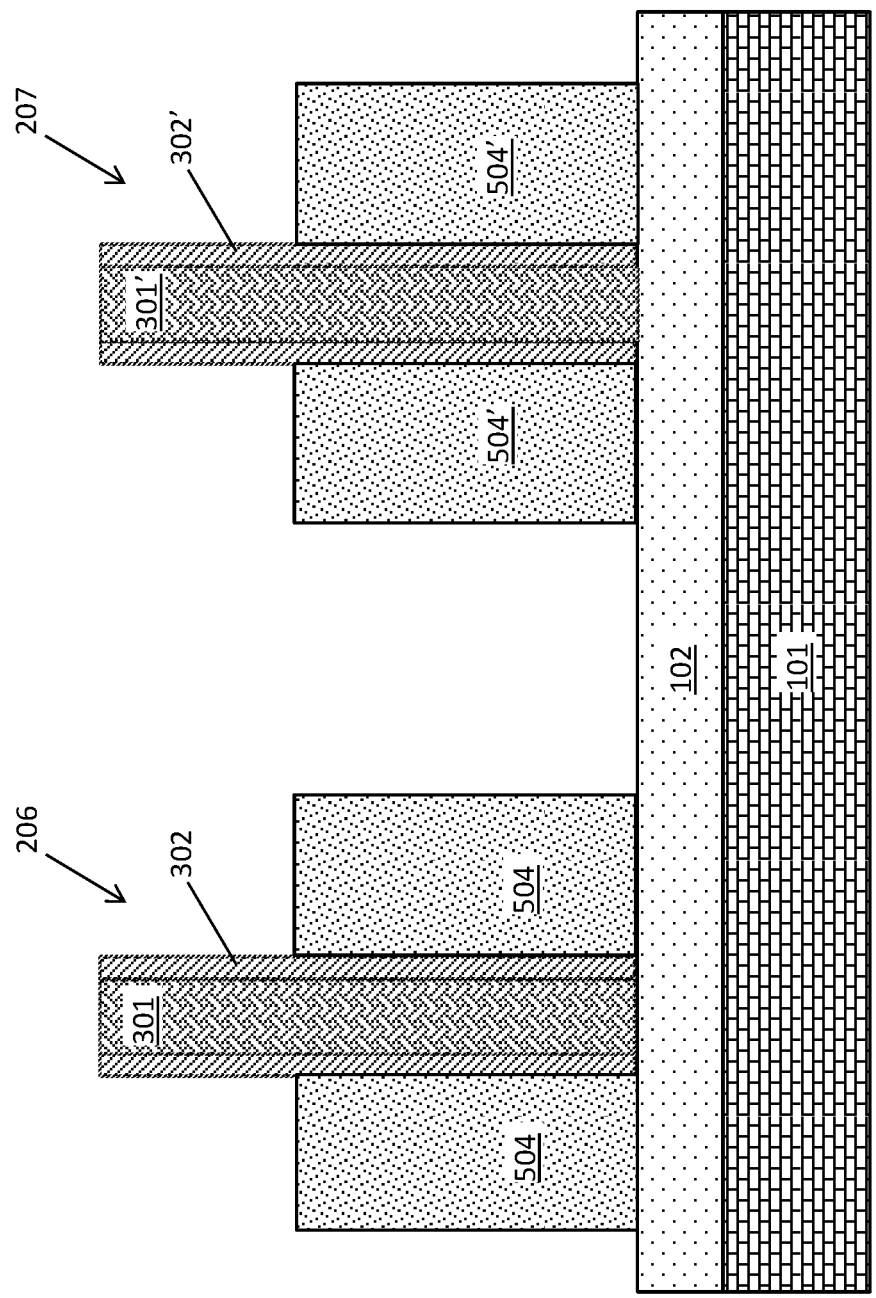

FIG. 5 is a cross-sectional side view after depositing semiconductor material 504, 504' on opposing sides of the dummy gates 301, 301'. The semiconductor material 504 forms source/drains of the FET area 206. The semiconductor material 504' forms an emitter and a collector on opposing sides of the dummy gate 301' of the BJT area 207. The emitter is the node that provides the current, and the collector is the node that collects the current.

The semiconductor material 504, 504' can be deposited by performing an epitaxial growth process to grow semiconductor material on the first nanosheet stack 203 and the second nanosheet stack 203'. The semiconductor material 504, 504' can be formed by, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes. The semiconductor material 504, 504' is doped with an n-type dopant (e.g., phosphorus or arsenic) or a p-type dopant (e.g., boron), depending on the type of transistor.

In one or more embodiments, the semiconductor material 504 of the FET area 206 is doped with an n-type dopant. In other embodiments, the semiconductor material 504 of the FET area 206 is doped with a p-type dopant.

In one or more embodiments, the semiconductor material 504' of the BJT area 207 serves as emitter/collectors. One semiconductor material 504' of the BJT area 207 forms an emitter, which includes a n-type dopant, and another source/drain 504' forms a collector, which includes a p-type dopant.

Figure 6:
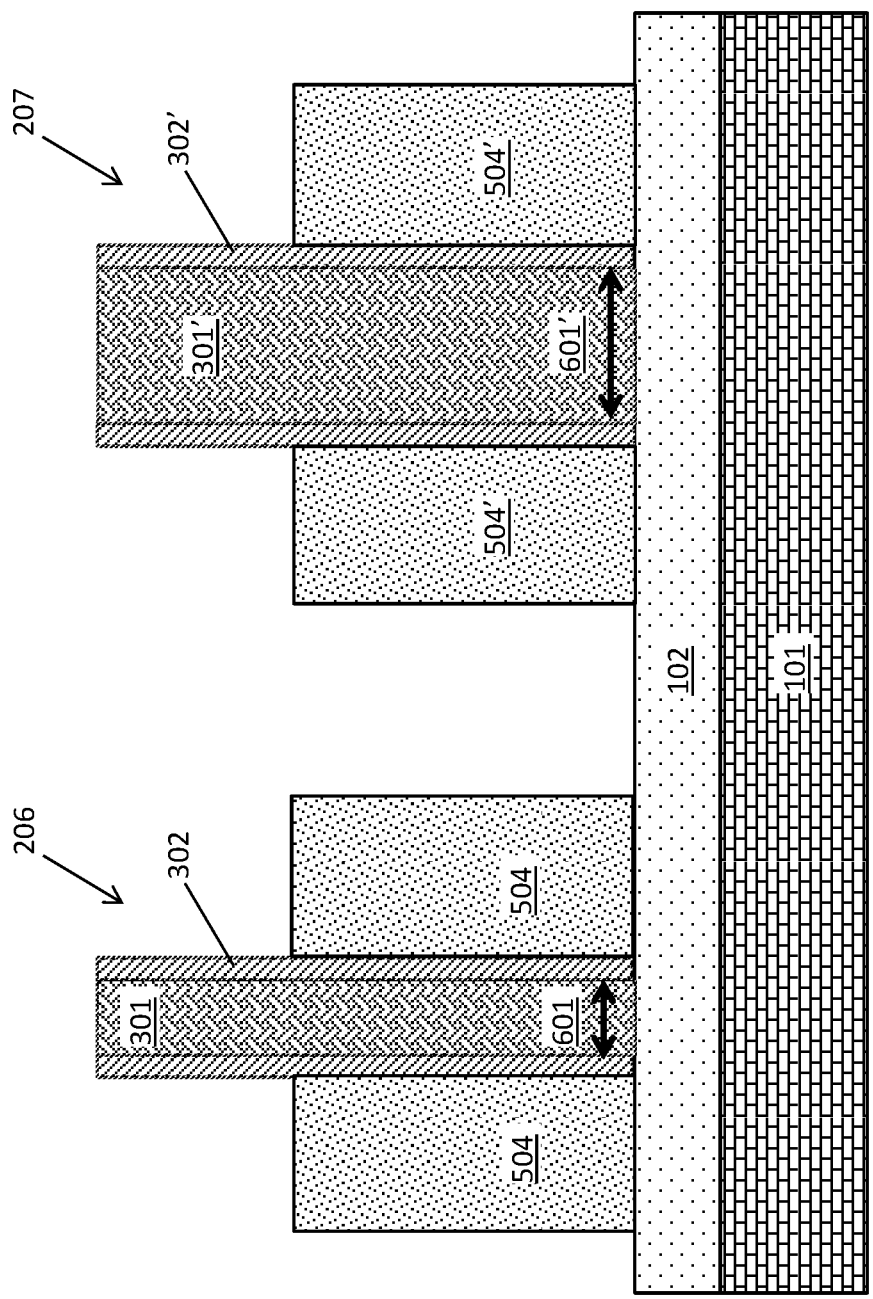

FIG. 6 is a cross-sectional side view of a FET area 206 and adjacent BJT area 207 with a larger gate according to one or more embodiments. The width 601' of the gate 301' in the BJT area 207 can be different than the width 601 of the gate 301 in the FET area 206. According to one or more embodiments, the width 601' of the gate 301' of the BJT area 207 is larger than the width 601 of the gate 301 of the FET area 206. Because the gate 301' forms the base of the BJT area 207, a precisely defined width 601' is important for analog gain. In some embodiments, the width 601' of the gate 301' of the BJT area 207 is in a range from about 20 nm to about 100 nm, and the width 601 of the gate 301 of the FET area 206 is in a range from about 20 nm to about 100 nm.

The widths of the FET area 206 and BJT area 207 gates can be tailored as desired, depending on the desired application. In some embodiments, the widths of the gates can be the same, for example, as shown in FIGS. 4 and 5. In other embodiments, the widths of the gates can be different, for example, as shown in FIG. 6. The process flows for forming the gates in the FET area 206 and the BJT area 207 will proceed through the processing shown in the following figures.

Figure 7:
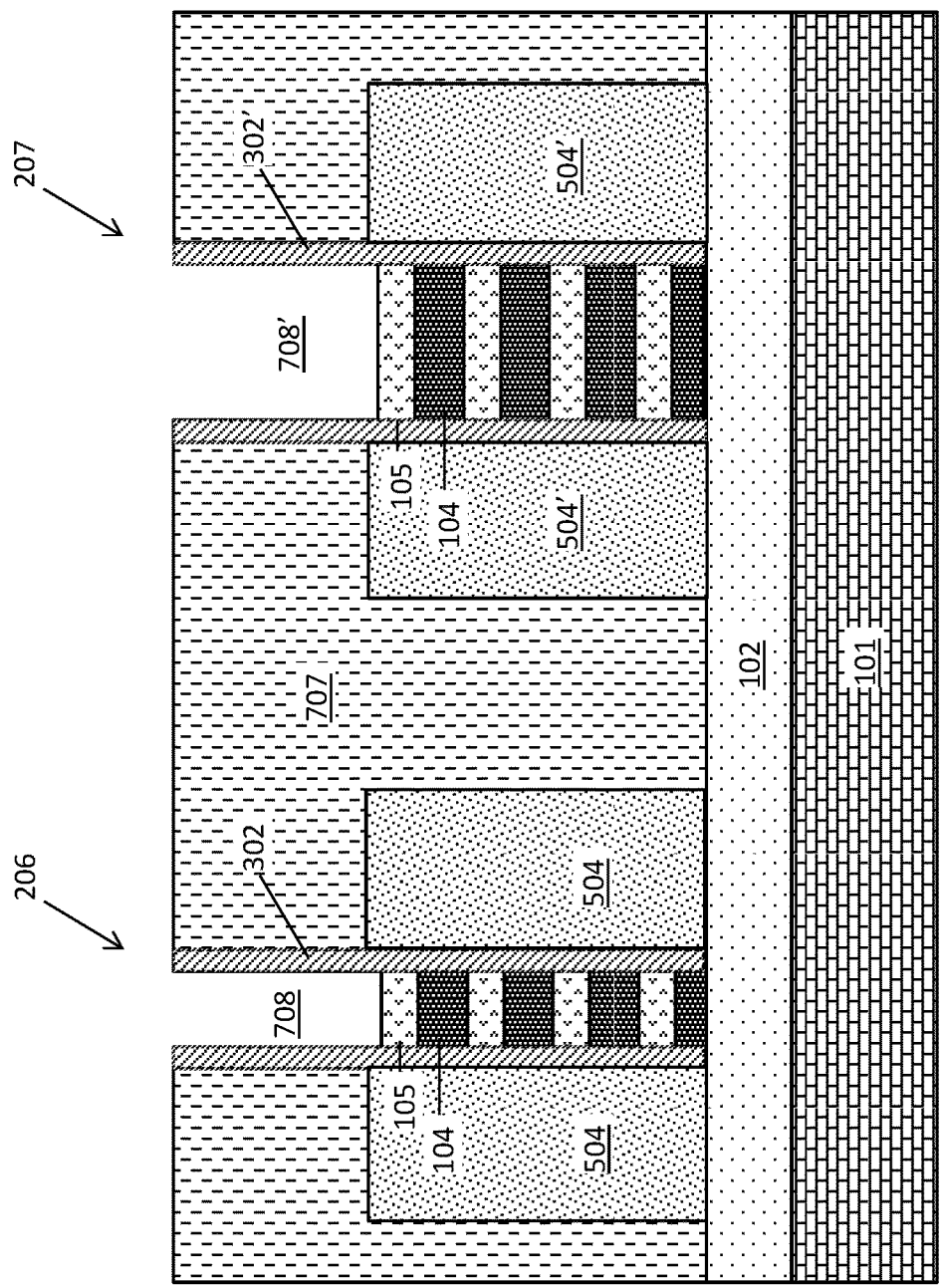

FIG. 7 is a cross-sectional side view after depositing an interlevel dielectric (ILD) 707 and removing the dummy gates. Trenches 708, 708' are formed over the nanosheet stacks between the gate spacers 302, 302'.

The ILD 707 is deposited on the dummy gates, the semiconductor material 504, 504', and the substrate 101. The ILD 707 includes a dielectric material, including but not limited to, silicon dioxide, spin-on-glass, a flowable oxide, a high density plasma oxide, borophosphosilicate glass (BPSG), or any combination thereof. The ILD 707 is deposited by a deposition process, including, but not limited to CVD, PVD, plasma enhanced CVD (PECVD), atomic layer deposition (ALD), evaporation, chemical solution deposition, or like processes. A planarization process, for example, chemical mechanical planarization (CMP), is performed to remove a portion of the ILD 707 to expose the dummy gates 301, 301' (see FIG. 6).

The dummy gate material from the FET area 206 and BJT area 207 can be removed by performing an etch process that is selective to (will not substantially etch) the gate spacers 302, 302' and the ILD 707. The etch process can include, but is not limited to, reactive ion etch (RIE), plasma etch, aqueous etching containing an etchant of ammonia, or any suitable combination thereof. Removing the dummy gate materials exposes the top surfaces of the nanosheet stacks, and in particular, the second nanosheets 105 of the nanosheet stack as shown in FIG. 7.

Figure 8:
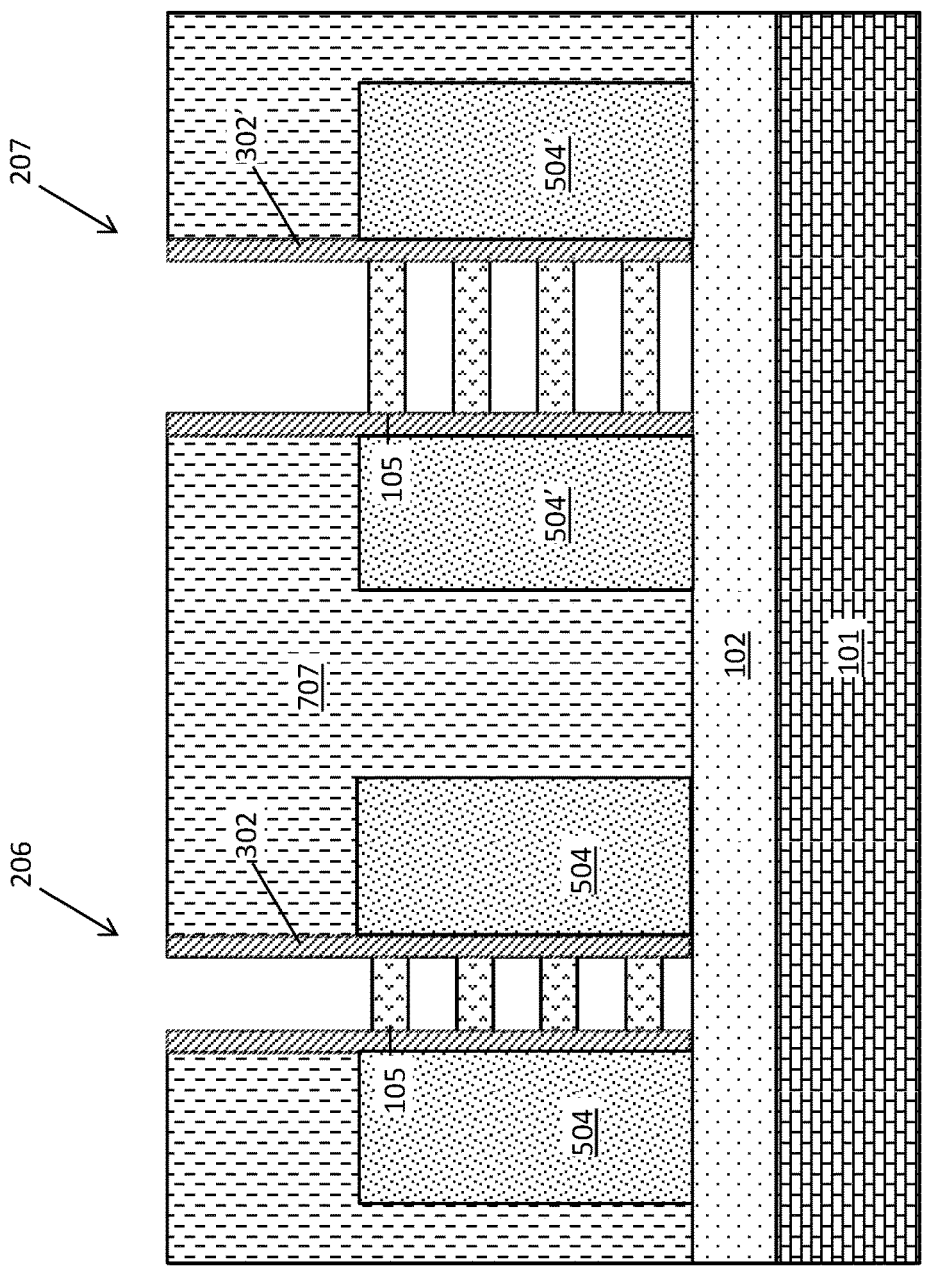

FIG. 8 is a cross-sectional side view after selectively removing the first nanosheets in the channel regions. Removal of the dummy gate material exposes the first and second nanosheets 104, 105. The first nanosheets 104 are selectively removed in the region between the gate spacers 302, 302'. The second nanosheets 105 remain suspended in the gate (channel) region. After removing the first nanosheets 104, openings are formed between the second nanosheets 105, or above and below the second nanosheet 105. The remaining suspended second nanosheets 105 form channel regions.

In one or more embodiments, first nanosheets 104 include silicon germanium, and second nanosheets 105 include silicon. Because the first and second nanosheets 104, 105 include different semiconductor materials, the first nanosheets 104 can be selectively etched. The first nanosheets 104 can be removed by performing a selective wet etch process that includes, for example, buffered hydrofluoric acid (BHF), hydrofluoric acid (HF), hydrofluoric nitric acid (HNA), phosphoric acid, HF diluted by ethylene glycol (HFEG), hydrochloric acid (HCl), or any combination thereof.

Figure 9:
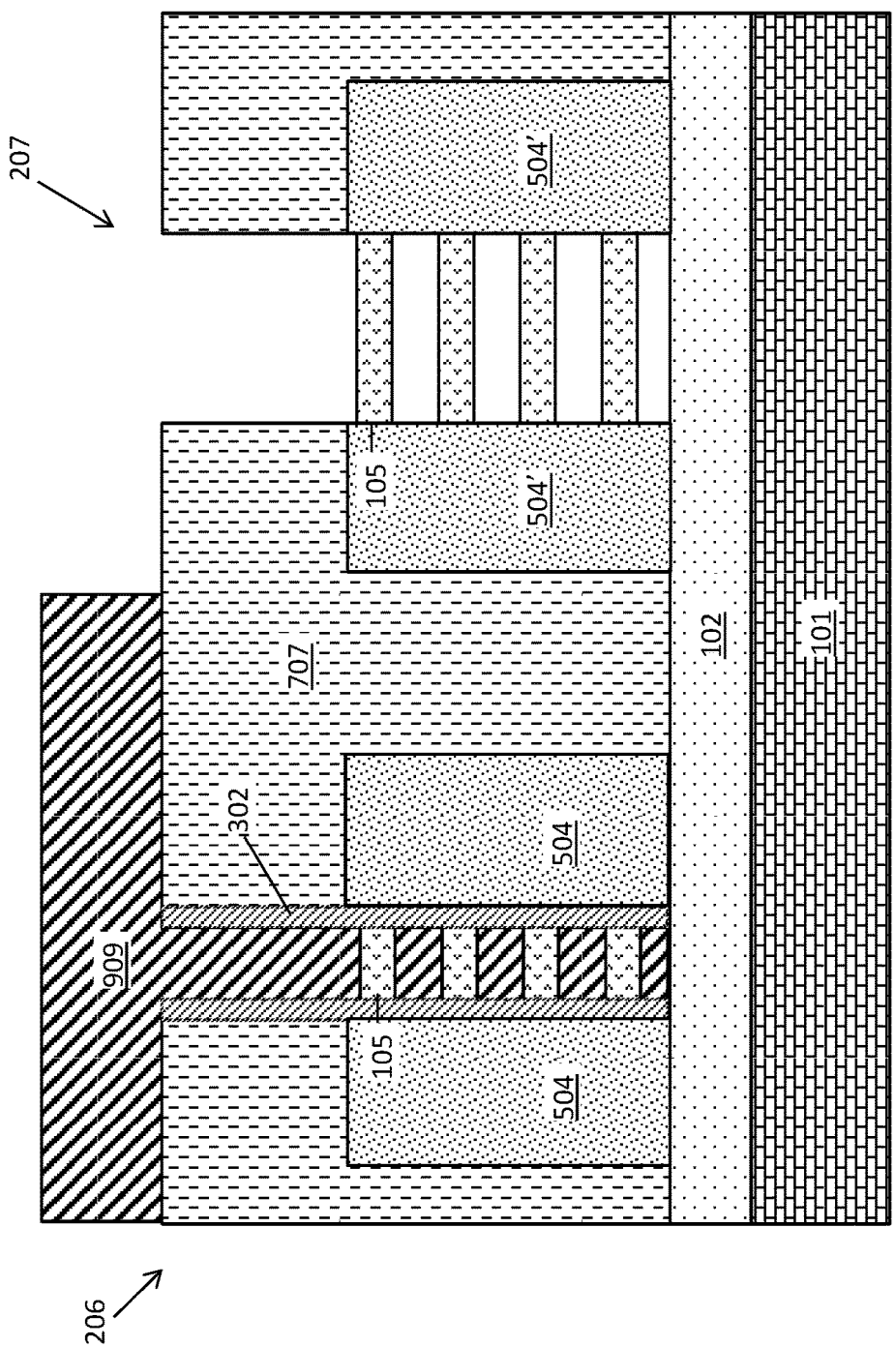

FIG. 9 is a cross-sectional side view after depositing a mask 909 on the FET area 206 and removing gate spacers 302' (see FIG. 8) in the BJT area 207. The mask 909 protects the FET area 206 and exposes the BJT area 207 so that the spacers 302' can be selectively removed. The mask 909 can be any suitable protective material, for example, a photoresist material, amorphous carbon, or organic planarization (OPL) layer.

The spacers 302' are selectively removed by, for example, etching. The etch process can be wet etch, for example, using hydrofluoric acid (HF) or phosphoric acid.

Figure 10:
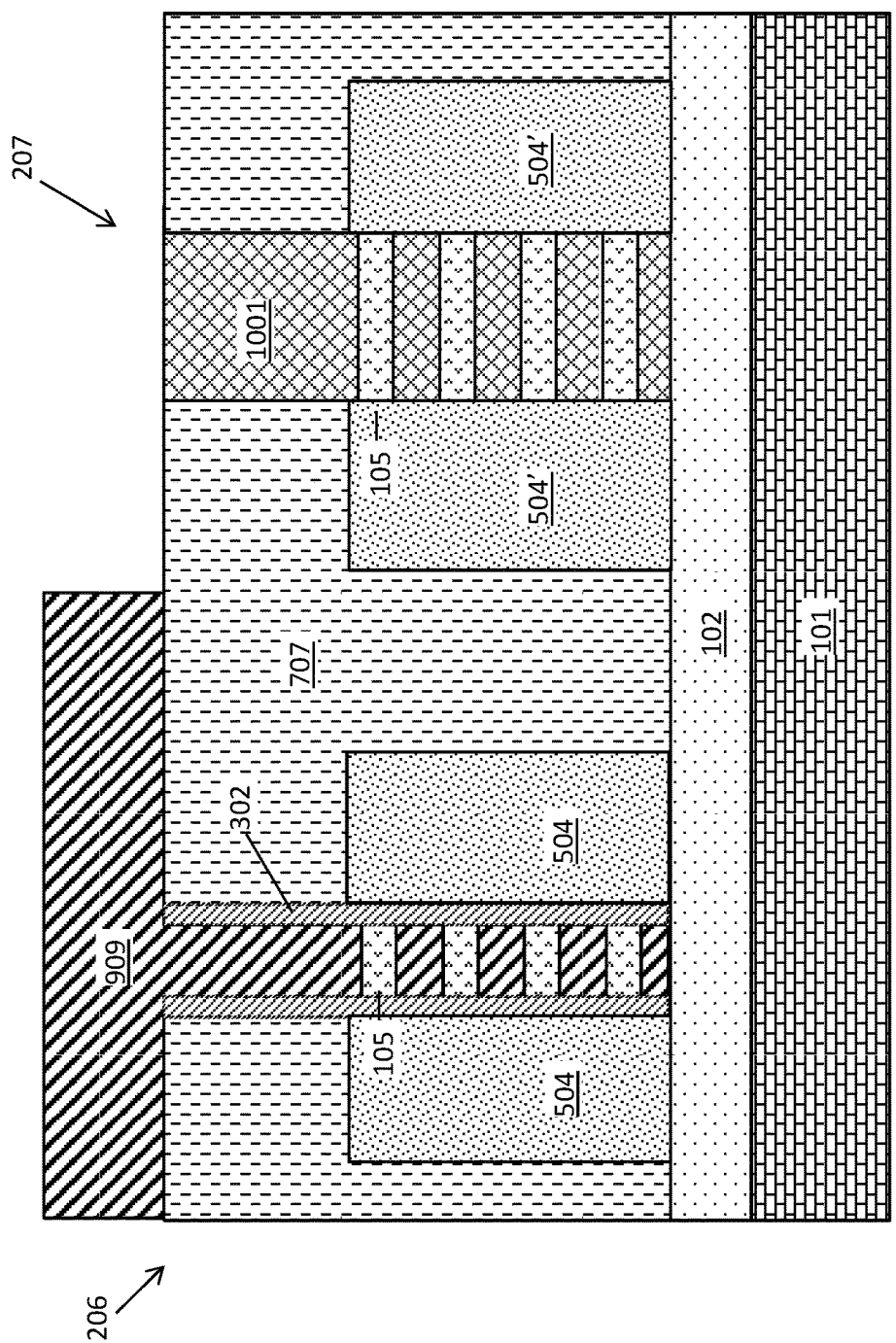

FIG. 10 is a cross-sectional side view after depositing doped semiconductor material 1001 in the BJT area 207 channel region. The doped semiconductor material 1001 fills the areas between the second nanosheets 105 (where the first nanosheets 104 were present, as shown in FIG. 7). The doped semiconductor material can be doped with n-type dopant (e.g., phosphorus or arsenic) or a p-type dopant (e.g., boron).

The doped semiconductor material 1001 can be formed by performing an epitaxial growth process to form epitaxial growth in the BJT area 207 channel region. The doped semiconductor material 1001 is deposited on and around the second nanosheets 105. The doped semiconductor material can be deposited by, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes. The semiconductor material can be doped before or after deposition to form the doped semiconductor material 1001.

In one or more embodiments, the semiconductor material 504' of the BJT area 207 includes n-type dopants, and the doped semiconductor material 1001 includes a p-type doped silicon, which forms an "NPN" BJT. An "NPN" BJT includes two junctions, an N-P junction between the source/drain and the channel, and a P-N junction between the channel and the other source/drain. In one or more embodiments, the second nanosheets 105 are doped during deposition of the semiconductor material 1001 so that the second nanosheets 105 become part of the base of the BJT area 207.

In one or more embodiments, the semiconductor material 504' of the BJT area 207 includes p-type dopants, and the doped semiconductor material 1001 includes an n-type doped silicon, which forms a "PNP" BJT. An "PNP" BJT includes two junctions, an P-N junction between the source/drain and the channel, and a N-P junction between the channel and the other source/drain. In one or more embodiments, the second nanosheets 105 are doped during deposition of the semiconductor material 1001 so that the second nanosheets 105 become part of the base of the BJT area 207.

Figure 11:
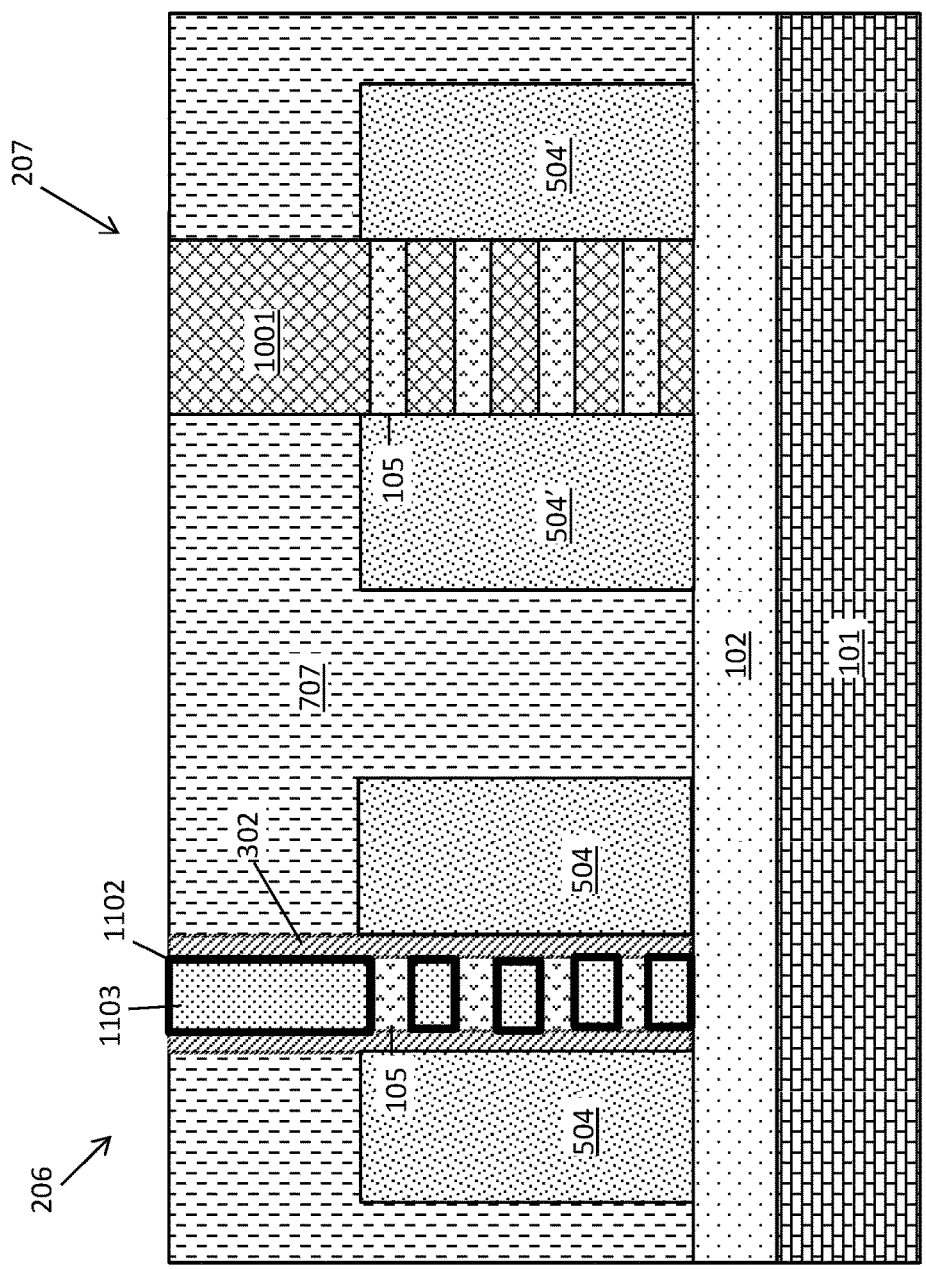

FIG. 11 is a cross-sectional side view after removing the mask and forming metal gate stacks in the FET area 206. The metal gate stacks are formed by filling the gate trenches with one or more dielectric materials 1102, one or more work function metals, and one or more metal gate conductor materials 1103. The metal gate stacks fill the openings on and around (or between) the second nanosheets 105.

The gate dielectric material 1102 can be a dielectric material having a dielectric constant greater than, for example, 3.9, 7.0, or 10.0. Non-limiting examples of suitable materials for the dielectric material 1102 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum. The gate dielectric material 1102 can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes.

A work function metal and a metal gate conductor material 1103 are deposited on the gate dielectric material 1102. The work function metal is initially disposed over the gate dielectric material. The type of work function metal depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal can be deposited by a suitable deposition process, for example, CVD, PECVD, PVD, plating, thermal or e-beam evaporation, and sputtering.

A gate conductor material 1103 is deposited over the work function metal and the gate dielectric material 1102 to form the metal gate stacks. Non-limiting examples of suitable gate conductor materials 1103 include aluminum (Al), platinum (Pt), gold (Au), tungsten (W), titanium (Ti), or any combination thereof. The gate conductor material can be deposited by a suitable deposition process, for example, CVD, PECVD, PVD, plating, thermal or e-beam evaporation, and sputtering. A planarization process, for example, chemical mechanical planarization (CMP), is performed to polish the surface of the gate conductor material 1103 and form the metal gate stacks in the FET area 206.

Figure 12:
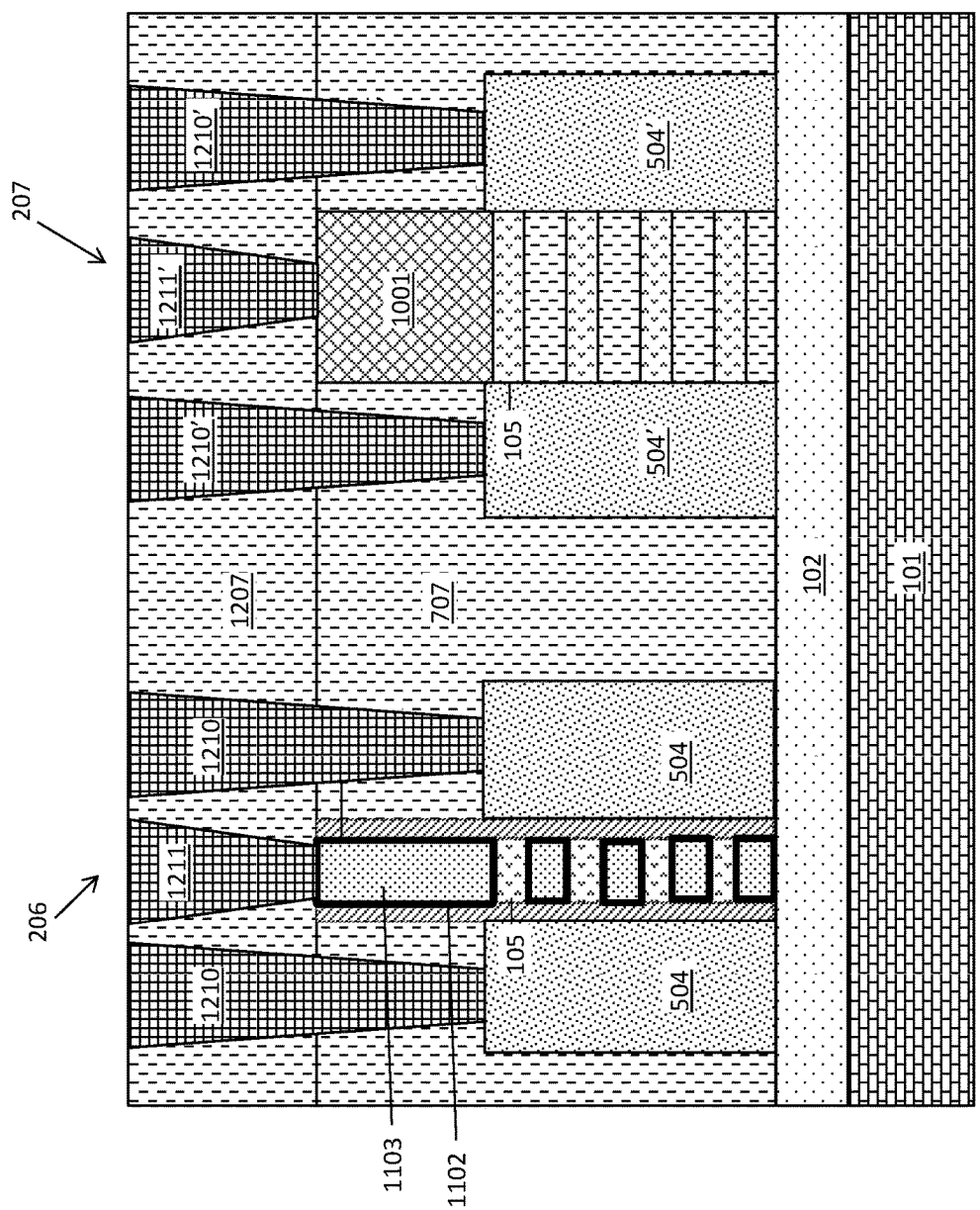

FIG. 12 is a cross-sectional side view after forming contacts. Another layer of ILD 1207 is deposited on both the FET area 206 and BJT area 207. Source/drain contacts 1210 and a gate contact 1211 are formed over the source/drains 504 and the gate of the FET area 206. Contacts 1210' are formed over the emitter/collectors, formed by semiconductor material 504'. A contact 1211' is also formed over the doped semiconductor material 1001 of the BJT area 207.

The contacts shown in FIG. 12 are formed by removing portions of the ILD 707, 1207 to form trenches and then filling the trenches with one or more contact materials. The trenches can be formed, for example, by depositing a mask (not shown), for example, a photoresist, on the ILD 1207. The mask is patterned, and the pattern is transferred into the ILD 707, 1207 by removing the ILD 707, 1207. The ILD 707, 1207 is removed by a suitable etching process, for example, RIE process. The mask can be removed after forming the trenches.

One or more contact metals are deposited in the trenches within the ILD 707, 1207 to form the contacts. The contacts can include a silicide film and/or one or more conductive metals. A metal silicide film can be formed by performing a thermal treatment to a metallic film. The metallic film can be deposited by performing an evaporation process or a sputtering process. The metallic film is then annealed by heating inside a furnace or performing a rapid thermal treatment in an atmosphere that includes pure inert gases. Non-limiting examples of suitable metal silicide materials include titanium silicide, tungsten silicide, cobalt silicide, nickel silicide, molybdenum silicide, platinum silicide, or any combination thereof. The conductive material can be, but is not limited to, aluminum (Al), platinum (Pt), gold (Au), tungsten (W), titanium (Ti), or any combination thereof. The conductive material can be deposited by a suitable deposition process, for example, CVD, PECVD, PVD, plating, thermal or e-beam evaporation, or sputtering. A planarization process, for example, CMP, is performed to remove any conductive material from the surface of the ILD 1207.

The resulting device shown in FIG. 12 provides a FET area 206 and BJT area 207 on the same chip. The emitter/collectors of the BJT area 207 and the source/drains of the FET area 206 are formed in the same processing steps (described above in FIG. 5), which is cost-effective. The width/base size of the BJT channel can be tailored as desired, although the same process flows for forming the FET can be used.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a field effect transistor (FET) and a bipolar junction transistor (BJT) on a common substrate, the method comprising:
    forming a first nanosheet stack in a FET region and a second nanosheet stack in a BJT region of the common substrate;
    forming a first dummy gate on the first nanosheet stack and a second dummy gate on the second nanosheet stack;
    depositing a semiconductor material on opposing sides of the first dummy gate and the second dummy gate;
    removing a first nanosheet from each of the first nanosheet stack and the second nanosheet stack;
    removing the second dummy gate in the BJT region; and
    depositing doped semiconductor material on and around the second nanosheet of the BJT region.

2. The method of claim 1, wherein depositing the semiconductor material comprises performing an epitaxial growth process.

3. The method of claim 1, wherein the semiconductor material comprises n-type doped semiconductor material.

4. The method of claim 1, wherein a width of the second dummy gate of the BJT is greater than a width of the first dummy gate of the FET.

5. The method of claim 1, wherein the first nanosheet comprises silicon.

6. The method of claim 5, wherein the first nanosheet alternates with a second nanosheet comprising silicon germanium.

7. The method of claim 1 further comprising depositing a mask on the FET region before removing the second dummy gate from the BJT region.

8. The method of claim 1, wherein the doped semiconductor material comprises epitaxially grown semiconductor material.

9. The method of claim 8, wherein the epitaxially grown semiconductor material comprises a p-type dopant.

10. The method of claim 1, wherein the semiconductor material deposited on the second dummy gate forms the emitter and the collector of the BJT region.

11. The method of claim 10, wherein the semiconductor material comprises an n-type dopant.

12. The method of claim 1, wherein the first dummy gate and the second dummy gate each comprise gate spacers.

13. The method of claim 12, wherein removing the first nanosheet comprises a selective etch process that results in a second nanosheet remaining suspended between the gate spacers.

14. The method of claim 1 further comprising removing the first dummy gate prior to removing the first nanosheet.

15. The method of claim 14 further comprising replacing sacrificial material of the first dummy gate with a metal gate stack.

16. The method of claim 15, wherein the metal gate stack comprises a dielectric layer and a conductive metal.

17. The method of claim 1, wherein the BJT has an N-P junction and a P-N junction.

18. A semiconductor device, comprising:
 a field effect transistor (FET) comprising a nanosheet extending through a channel region of a gate; and
 a bipolar junction transistor (BJT) comprising a nanosheet comprising a semiconductor material extending from an emitter to a collector.

19. The semiconductor device of claim 18, wherein the FET further comprises a pair of source/drains comprising an epitaxial semiconductor material on opposing sides of the gate.

20. The semiconductor device of claim 18, wherein the BJT further comprises a doped semiconductor material arranged above and below the nanosheet.

* * * * *